United States Patent
Ye

(10) Patent No.: US 12,360,974 B2
(45) Date of Patent: Jul. 15, 2025

(54) SYSTEMS AND METHODS FOR DATA STORAGE

(71) Applicant: WUHAN UNITED IMAGING HEALTHCARE CO., LTD., Hubei (CN)

(72) Inventor: Chunguang Ye, Wuhan (CN)

(73) Assignee: WUHAN UNITED IMAGING HEALTHCARE CO., LTD., Wuhan (CN)

(*) Notice: Subject to any disclaimer, the term of this patent is extended or adjusted under 35 U.S.C. 154(b) by 114 days.

(21) Appl. No.: 18/069,195

(22) Filed: Dec. 20, 2022

(65) Prior Publication Data

US 2023/0195704 A1    Jun. 22, 2023

(30) Foreign Application Priority Data

Dec. 20, 2021 (CN) .......................... 202111560125.6

(51) Int. Cl.
*G06F 16/00* (2019.01)
*G06F 16/22* (2019.01)

(52) U.S. Cl.
CPC ...... *G06F 16/2237* (2019.01); *G06F 16/2246* (2019.01)

(58) Field of Classification Search
CPC .......................... G06F 16/2237; G06F 16/2246
USPC ......................................................... 707/797
See application file for complete search history.

(56) References Cited

U.S. PATENT DOCUMENTS

| | | | |
|---|---|---|---|
| 7,068,192 B1 | 6/2006 | Dean et al. | |
| 10,128,868 B1 | 11/2018 | Gopal et al. | |
| 10,262,012 B2* | 4/2019 | Liu | G06F 16/86 |
| 2012/0079106 A1* | 3/2012 | Williams | H04L 63/0227 |
| | | | 709/224 |
| 2017/0060912 A1 | 3/2017 | Liu et al. | |
| 2017/0109398 A1 | 4/2017 | Stearn et al. | |
| 2020/0073868 A1* | 3/2020 | Delamare | H03M 7/707 |
| 2020/0372030 A1* | 11/2020 | Posner | G06F 3/0656 |

FOREIGN PATENT DOCUMENTS

| | | | |
|---|---|---|---|
| CN | 106547804 A | | 3/2017 |
| CN | 106815267 A | * | 6/2017 |
| CN | 107491510 A | | 12/2017 |

(Continued)

OTHER PUBLICATIONS

First Office Action in Chinese Application No. 202111560125.6 mailed on Aug. 21, 2024, 18 pages.

*Primary Examiner* — Monica M Pyo
(74) *Attorney, Agent, or Firm* — METIS IP LLC

(57) ABSTRACT

The present disclosure may provide systems and methods for data storage. The systems may store data of one or more fields as a byte sequence. The byte sequence may include a first section and a second section. The second section may be configured to store the data of the one or more fields. The first section may be configured to store one or more label items corresponding to the one or more fields. For one of the one or more label items and a corresponding field, the label item may include a field label of the corresponding field and a position label of the corresponding field. The position label of the corresponding field may be configured to identify a position where data of the corresponding field is stored in the second section.

17 Claims, 10 Drawing Sheets

(56) References Cited

FOREIGN PATENT DOCUMENTS

| CN | 108509595 | A |   | 9/2018  |           |
|----|-----------|---|---|---------|-----------|
| CN | 109104405 | A | * | 12/2018 | H04L 69/04 |
| CN | 112100261 | A |   | 12/2020 |           |

\* cited by examiner

500

Storing data of one or more fields as a byte sequence, the byte sequence comprising a first section and a second section, the second section being configured to store the data of the one or more fields, the first section being configured to store one or more label items corresponding to the one or more fields ~510

FIG. 5

SYSTEMS AND METHODS FOR DATA STORAGE

CROSS-REFERENCE TO RELATED APPLICATIONS

This application claims priority to Chinese Patent Application No. 202111560125.6 filed on Dec. 20, 2021, the entire contents of which are hereby incorporated by reference.

TECHNICAL FIELD

The present disclosure generally relates to a technical field of computer technology, and more particularly, relates to a technical field of data storage.

BACKGROUND

At present, in the field of data storage, data of different structures are generally stored in different data tables, or serialized into strings by using JSON (JavaScript Object Notation) and stored in a same data table uniformly. However, the storage in different data tables may lead to development and maintenance of different versions of data warehouse codes, which increases maintenance workloads of the data warehouse and makes the scalability of the data warehouse poor. Data stored as serialized strings (serialized by using JSON) may occupy a lot of storage space, causing a large storage waste and/or making the decoding efficiency for data analysis and/or data querying poor.

Therefore, it is desirable to provide a data storage method and system for efficiently storing data and/or improving decoding rate during data querying and/or data analysis.

SUMMARY

According to an aspect of the present disclosure, a system may be provided. The system may include: at least one storage device including a set of instructions; at least one processor in communication with the at least one storage device, wherein when executing the set of instructions, the at least one processor may be configured to cause the system to perform operations including storing data of one or more fields as a byte sequence, the byte sequence comprising a first section and a second section, the second section being configured to store the data of the one or more fields, the first section being configured to store one or more label items corresponding to the one or more fields. For one of the one or more label items and a corresponding field, the label item may include a field label of the corresponding field and a position label of the corresponding field. The position label of the corresponding field may be configured to identify a position where data of the corresponding field is stored in the second section.

In some embodiments, the label item may include a field identifier of the corresponding field. The field identifier may include an identity of the corresponding field.

In some embodiments, the one or more label items may be ordered based on one or more field identifiers of the one or more label items.

In some embodiments, the one or more field identifiers and the data of the one or more fields may be stored in a form of metadata based on a maptree structure. The one or more field identifiers may be stored via at least one field structure.

In some embodiments, the first section may further include version information of at least one of an encoding technique or a decoding technique used to store the data of the one or more fields.

In some embodiments, the first section may further include positioning information. The positioning information may include at least one of a count of the one or more fields, a length of the first section, or an initial position of the second section.

In some embodiments, the label item may further include a parent identifier configured to identify a parent field of the one or more fields.

In some embodiments, the label item may further include a sub-position identifier and a second sub-position identifier. The sub-position identifier may be configured to identify an initial subfield of the parent field. The second sub-position identifier may be configured to identify a position of a subsequent subfield which has a same parent field as the initial subfield.

In some embodiments, the label item may further include an identifier of a compression technique used to compress the data of the one or more fields.

In some embodiments, the data of the one or more fields may be stored in the second section based on the compression technique.

In some embodiments, the second section may include one or more ending identifiers. One of the one or more ending identifiers may be located at an end of the data of the corresponding field. The ending identifier may be configured to identify at least one of an ending of the corresponding field, or a position of data of a subsequent field of the corresponding field in the second section.

According to another aspect of the present disclosure, a method may be provided. The method may be implemented on a computing device having at least one processor and at least one storage device. The method may include: storing data of one or more fields as a byte sequence, the byte sequence comprising a first section and a second section, the second section being configured to store the data of the one or more fields, the first section being configured to store one or more label items corresponding to the one or more fields. For one of the one or more label items and a corresponding field, the label item may include a field label of the corresponding field and a position label of the corresponding field. The position label of the corresponding field may be configured to identify a position where data of the corresponding field is stored in the second section.

In some embodiments, the label item may include a field identifier of the corresponding field. The field identifier may include an identify of the corresponding field.

In some embodiments, the one or more label items may be ordered based on one or more field identifiers of the one or more label items.

In some embodiments, the first section may further include version information of at least one of an encoding technique or a decoding technique used to store the data of the one or more fields.

In some embodiments, the first section may further include positioning information. The positioning information may include at least one of a count of the one or more fields, a length of the first section, or an initial position of the second section.

In some embodiments, the label item may further include a parent identifier configured to identify a parent field of the one or more fields.

In some embodiments, the label item may further include an identifier of a compression technique used to compress the data of the one or more fields.

In some embodiments, the second section may include one or more ending identifiers, one of the one or more ending identifiers being located at an end of the data of the corresponding field. The ending identifier may be configured to identify at least one of an ending of the corresponding field, or a position of data of a subsequent field of the corresponding field in the second section.

According to another aspect of the present disclosure, a non-transitory computer-readable medium may be provided. The non-transitory computer-readable medium may include executable instructions, wherein when executed by at least one processor, the executable instructions may direct the at least one processor to perform a method, and the method includes: storing data of one or more fields as a byte sequence, the byte sequence comprising a first section and a second section, the second section being configured to store the data of the one or more fields, the first section being configured to store one or more label items corresponding to the one or more fields. For one of the one or more label items and a corresponding field, the label item may include a field label of the corresponding field and a position label of the corresponding field. The position label of the corresponding field may be configured to identify a position where data of the corresponding field is stored in the second section.

Additional features may be set forth in part in the description which follows, and in part may become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 5 is a flowchart illustrating an exemplary data storage process according to some embodiments of the present disclosure;

DETAILED DESCRIPTION

Figure 1:
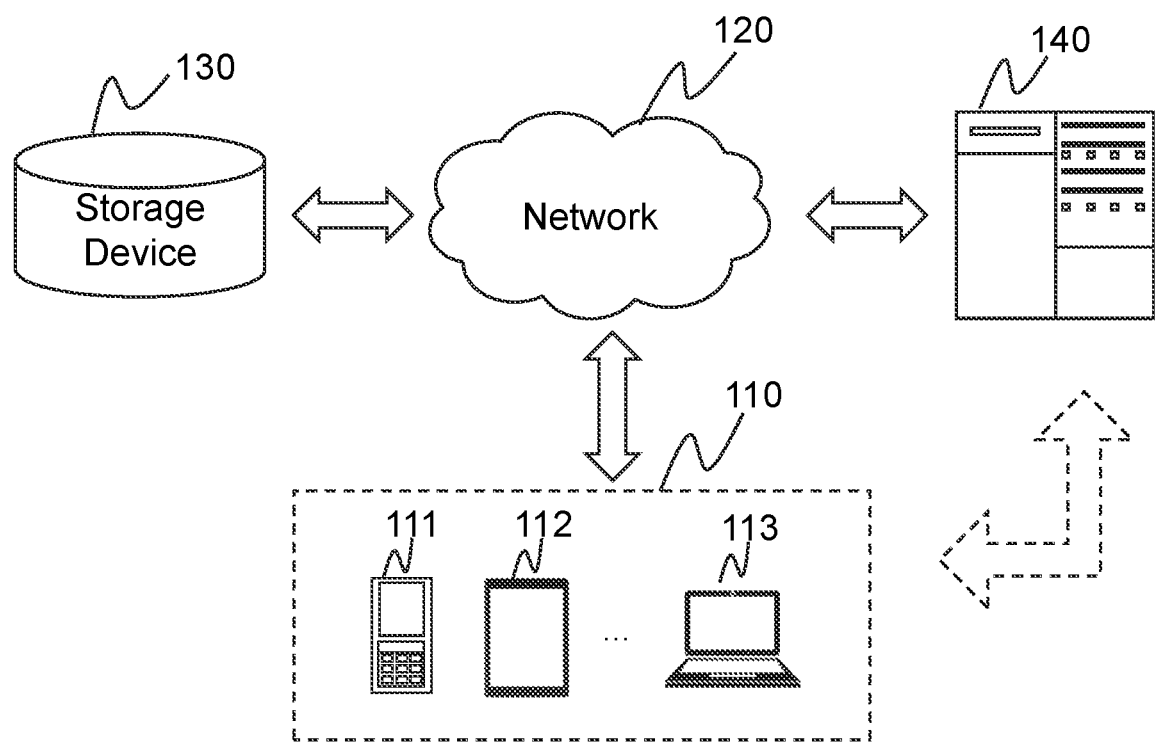
FIG. 1 is a schematic diagram illustrating an exemplary data storage system according to some embodiments of the present disclosure.

In the following detailed description, numerous specific details may be set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments may be readily apparent to those skilled in the art, and the general principles defined herein may be applied to other embodiments and applications without departing from the spirit and scope of the present disclosure. Thus, the present disclosure may be not limited to the embodiments shown, but to be accorded the widest scope consistent with the claims.

The terminology used herein may be for the purpose of describing particular example embodiments only and may be not intended to be limiting. As used herein, the singular forms "a," "an," and "the" may be intended to include the plural forms as well, unless the context clearly indicates otherwise. It may be understood that the terms "system," "unit," "module," and/or "block" used herein are one method to distinguish different components, elements, parts, sections or assemblies of different levels in ascending order. However, the terms may be displaced by another expression if they achieve the same purpose.

The modules (or units, blocks, units) described in the present disclosure may be implemented as software and/or hardware modules and may be stored in any type of non-transitory computer-readable medium or other storage devices. In some embodiments, a software module may be compiled and linked into an executable program. It may be appreciated that software modules may be callable from other modules or from themselves, and/or may be invoked in response to detected events or interrupts. Software modules configured for execution on computing devices may be provided on a computer readable medium or as a digital download (and can be originally stored in a compressed or installable format that requires installation, decompression, or decryption prior to execution). Such software code may be stored, partially or fully, on a memory device of the executing computing device, for execution by the computing device. Software instructions may be embedded in a firmware, such as an EPROM. It may be further appreciated that hardware modules (e.g., circuits) may be included in connected or coupled logic units, such as gates and flip-flops, and/or may be included in programmable units, such as programmable gate arrays or processors. The modules or computing device functionality described herein may be preferably implemented as hardware modules, but may be software modules as well. In general, the modules described herein refer to logical modules that may be combined with other modules or divided into units despite their physical organization or storage.

Certain terminology has been used to describe embodiments of the present disclosure. For example, the terms "one embodiment," "an embodiment," and/or "some embodiments" may mean that a particular feature, structure or characteristic described in connection with the embodiment is in at least one embodiment of the present disclosure. Therefore, it is emphasized and should be appreciated that two or more references to "an embodiment" or "one embodiment" or "an alternative embodiment" in various portions of this specification may not necessarily all referring to the same embodiment. Furthermore, the particular features, structures or characteristics may be combined as suitable in one or more embodiments of the present disclosure.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings may be for the purpose of illustration and description only and may be not intended to limit the scope of the present disclosure.

The flowcharts used in the present disclosure may illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

FIG. 1 is a schematic diagram illustrating an exemplary data storage system according to some embodiments of the present disclosure. As illustrated, the data storage system 100 may include a terminal 110, a network 120, a storage device 130, and a processing device 140. The components of the data storage system 100 may be connected in one or more of various ways. Merely by way of example, as illustrated in FIG. 1, the terminal 110 may be connected to the processing device 140 through the network 120. As another example, the terminal 110 may be connected to the processing device 140 directly (as indicated by the bi-directional arrow in dotted lines linking the terminal 110 and the processing device 140). As a further example, the storage device 130 may be connected to the processing device 140 directly or through the network 120.

The terminal 110 may include a mobile device 111, a tablet computer 112, a laptop computer 113, or the like, or any combination thereof. In some embodiments, the mobile device 111 may include a smart home device, a wearable device, a smart mobile device, a virtual reality device, an augmented reality device, or the like, or any combination thereof. In some embodiments, the terminal 110 may remotely operate the processing device 140. In some embodiments, the terminal 110 may operate the processing device 140 via a wireless connection. In some embodiments, the terminal 110 may receive information and/or instructions inputted by a user, and send the received information and/or instructions to the processing device 140 via the network 120. In some embodiments, the terminal 110 may receive data and/or information from the processing device 140. In some embodiments, the terminal 110 may be part of the processing device 140. In some embodiments, the terminal 110 may be omitted.

The network 120 may include any suitable network that can facilitate the exchange of information and/or data for the data storage system 100. In some embodiments, one or more components of the data storage system 100 (e.g., the terminal 110, the processing device 140, or the storage device 130) may communicate information and/or data with one or more other components of the data storage system 100 via the network 120. In some embodiments, the network 120 may be any type of wired or wireless network, or a combination thereof.

The storage device 130 may store data and/or instructions. In some embodiments, the storage device 130 may store data obtained from the terminal 110 and/or the processing device 140. In some embodiments, the storage device 130 may store data and/or instructions that the processing device 140 may execute or use to perform exemplary methods described in the present disclosure. For example, the storage device 130 may store data of one or more fields as a byte sequence. In some embodiments, the storage device 130 may include a mass storage device, a removable storage device, a volatile read-and-write memory, a read-only memory (ROM), or the like, or any combination thereof. In some embodiments, the storage device 130 may be implemented on a cloud platform.

The processing device 140 may process data and/or information obtained from the terminal 110 and/or the storage device 130. For example, the processing device 140 may store data of one or more fields as a byte sequence. In some embodiments, the processing device 140 may be a single server or a server group. The server group may be centralized or distributed. In some embodiments, the processing device 140 may be local or remote. In some embodiments, the processing device 140 may be implemented on a cloud platform.

In some embodiments, the storage device 130 may be connected to the network 120 to communicate with one or more components of the data storage system 100 (e.g., the terminal 110, the processing device 140, etc.). One or more components of the data storage system 100 may access the data or instructions stored in the storage device 130 via the network 120. In some embodiments, the storage device 130 may be part of the processing device 140.

In some embodiments, the data storage system 100 may further include one or more power supplies (not shown in FIG. 1) operably connected to one or more components of the data storage system 100 (e.g., the terminal 110, the processing device 140, the storage device 130, etc.).

Figure 2:
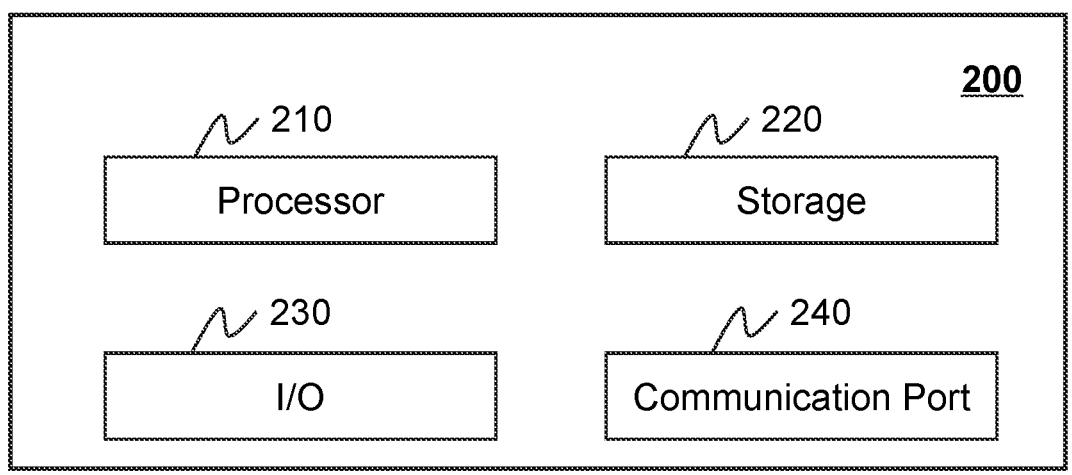
FIG. 2 is a schematic diagram illustrating hardware and/or software components of an exemplary computing device according to some embodiments of the present disclosure.

FIG. 2 is a schematic diagram illustrating exemplary hardware and/or software components of a computing device 200 on which the processing device 140 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and perform functions of the processing device 140 in accordance with techniques described herein. For example, the processor 210 may obtain data of one or more fields from the storage device 130 and/or a terminal 110. In some embodiments, the processor 210 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 200. However, it should be noted that the computing device 200 in the present disclosure may also include multiple processors, and thus operations of a method that are performed by one processor as described in the present disclosure may also be jointly or separately performed by the multiple processors. For example, if in the present disclosure the processor of the computing device 200 executes both operations A and B, it should be understood that operations A and step B may also be performed by two different processors jointly or separately in the computing device 200 (e.g., a first processor executes operation A and a second processor executes operation B, or the first and second processors jointly execute operations A and B).

The storage 220 may store data/information obtained from the terminal 110, the storage device 130, or any other component of the data storage system 100. In some embodiments, the storage 220 may include a mass storage device, a removable storage device, a volatile read-and-write memory, a read-only memory (ROM), or the like, or any combination thereof. In some embodiments, the storage 220 may store one or more programs and/or instructions to perform exemplary methods described in the present disclosure. For example, the storage 220 may store a program for the processing device 140 for storing data of one or more fields as a byte sequence.

The I/O 230 may input or output signals, data, or information. In some embodiments, the I/O 230 may enable user interaction with the processing device 140. In some embodiments, the I/O 230 may include an input device and an output device. Exemplary input devices may include a keyboard, a mouse, a touch screen, a microphone, a trackball, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected to a network (e.g., the network 120) to facilitate data communications. The communication port 240 may establish connections between the processing device 140 and the terminal 110, or the storage device 130. The connection may be a wired connection, a wireless connection, or a combination of both that enables data transmission and reception. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
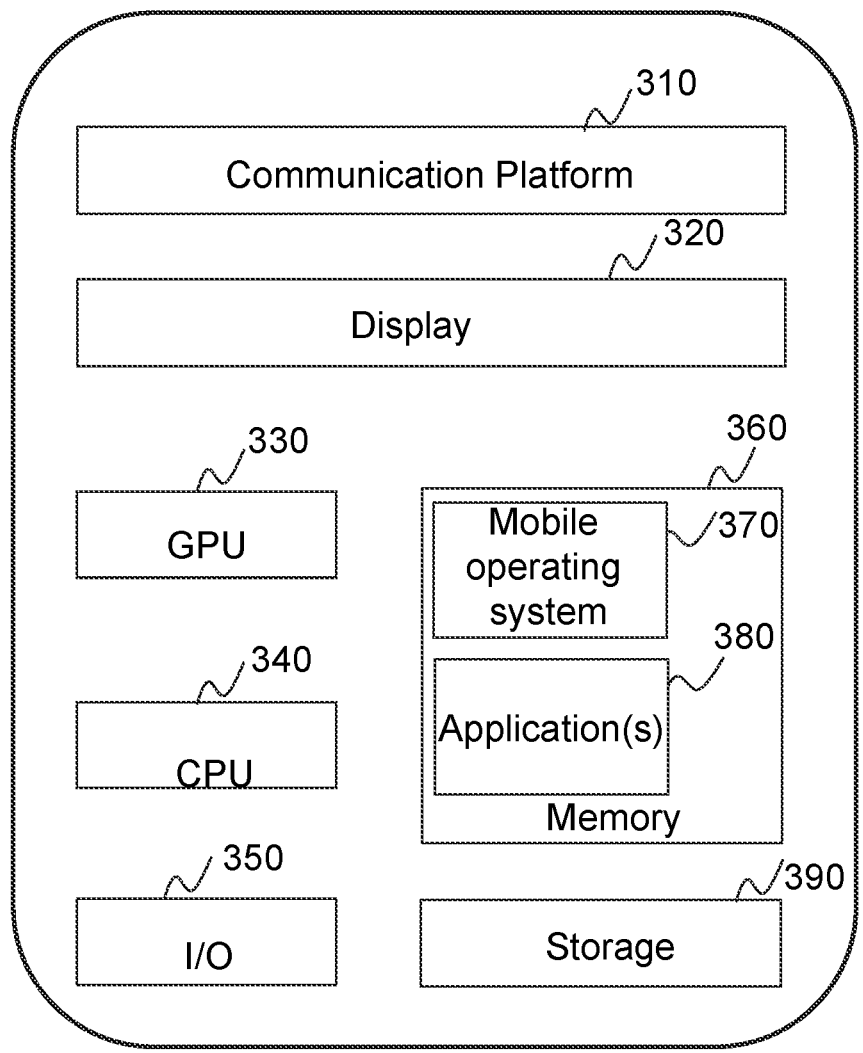
FIG. 3 is a schematic diagram illustrating hardware and/or software components of an exemplary mobile device according to some embodiments of the present disclosure.

FIG. 3 is a schematic diagram illustrating exemplary hardware and/or software components of a mobile device on which the terminal 110 may be implemented according to some embodiments of the present disclosure. As illustrated in FIG. 3, the mobile device 300 may include a communication platform 310, a display 320, a graphic processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving other data involved in a storage procedure. User interactions with the information stream may be achieved via the I/O 350 and provided to the processing device 140 and/or other components of the data storage system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to the data storage as described herein. A computer with user interface elements may be used to implement a personal computer (PC) or another type of work station or terminal, although a computer may also act as a server if appropriately programmed. It is believed that those skilled in the art are familiar with the structure, programming and general operation of such computer equipment and as a result the drawings should be self-explanatory.

Figure 4:
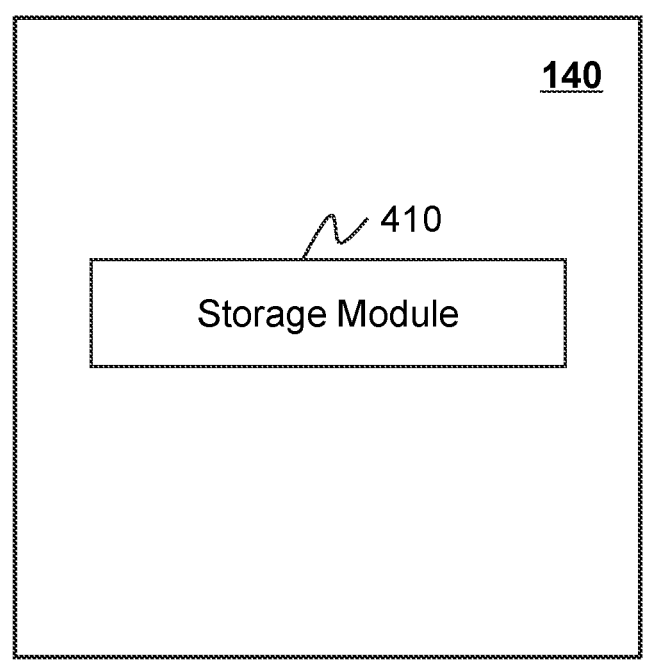
FIG. 4 is a block diagram illustrating an exemplary processing device according to some embodiments of the present disclosure.

FIG. 4 is a schematic block diagram illustrating exemplary processing devices according to some embodiments of the present disclosure. For illustration purposes, the processing device 140 may respectively be implemented on the computing device 200 as illustrated in FIG. 2 or the CPU 340 as illustrated in FIG. 3.

The processing device 140 may include a storage module 410. The storage module 410 may be configured to store data of one or more fields as a byte sequence. The byte sequence may include a first section and a second section. The second section may be configured to store the data of the one or more fields. The first section may be configured to store one or more label items corresponding to the one or more fields. For one of the one or more label items and a corresponding field, the label item may include a field label of the corresponding field and a position label of the corresponding field. The position label of the corresponding field may be configured to identify a position where data of the corresponding field is stored in the second section. More descriptions of storing the data of one or more fields as the byte sequence may be found elsewhere in the present disclosure, for example, FIGS. 5-10 or the descriptions thereof.

FIG. 5 is a flowchart illustrating an exemplary data storage process according to some embodiments of the present disclosure. In some embodiments, process 500 may be executed by the data storage system 100. For example, the process 500 may be implemented as a set of instructions (e.g., an application) stored in a storage device (e.g., the storage device 130, the storage 220, and/or the storage 390). In some embodiments, the processing device 140 (e.g., the processor 210 of the computing device 200, the CPU 340 of the mobile device 300, and/or one or more modules of the processing device 140 illustrated in FIG. 4) may execute the set of instructions and may accordingly be directed to perform the process 500. The operations of the illustrated process 500 presented below are intended to be illustrative. In some embodiments, the process 500 may be accomplished with one or more additional operations not described, and/or without one or more of the operations discussed. Additionally, the order in which the operations of the process 500 as illustrated in FIG. 5 and described below is not intended to be limiting.

In 510, the processing device 140 may store data of one or more fields as a byte sequence. The data may have or be divided into a plurality of parts, e.g., name data, gender data, age data, etc. Data of each of the one or more fields (also referred to as "data field") may correspond to one of the plurality of parts. In some embodiments, the data of the one or more fields may be heterogeneous data. For example, the data may be heterogeneous in data formats, heterogeneous in computer architectures, heterogeneous in operating systems, heterogeneous in data storage locations, heterogeneous in logical models of data storage, or the like, or any combination thereof. In some embodiments, the data may be heterogeneous in data formats, that is, the data may have different data formats. In some embodiments, a storage management mechanism for the data may include a relational database, for example, Oracle, SQL Server, DB2, etc. In some embodiments, the storage management mechanism for the data may include a file-type database (e.g., a two-dimensional database), for example, txt, CSV, XLS, etc.

In some embodiments, the data of the one or more fields may be used as data to be encoded. For example, the processing device 140 may encode the data of the one or more fields into the byte sequence for storage. When the data needs to be queried, the processing device 140 may decode the byte sequence for querying.

In some embodiments, data to be encoded of each field may include a field label and a field value. The field label may refer to a field name. For example, the field label may be an age and the field value may be 28. As another example, the field label may be a name, and the field value may be Zhang San. In some embodiments, the processing device 140 may convert the data to be encoded of the one or more fields into an ordered mapping table structure. For example, the ordered mapping table structure may include a tree data structure implemented based on a balanced binary tree. In some embodiments, the processing device 140 may obtain one or more field labels of the data to be encoded of the one or more fields. The processing device 140 may assign a field identifier (also referred to as an ID value) to each field in the data to be encoded of the one or more fields. The processing device 140 may obtain the ordered mapping table structure by performing a one-to-one correspondence between the field label of each field and the field identifier of each field in the data to be encoded of the one or more fields. In some embodiments, the field identifier may include a number of the corresponding field, such as 1, 2, 3, etc. In some embodiments, the field identifier may be assigned by a metadata management platform. Therefore, by mapping the field label (i.e., the field name) of each field in the data to be encoded to the field identifier of each field one by one, an original field label and a field value of the original field label may be converted into an ordered mapping table structure of the field identifier and the field value. The field label may be simplified by the field identifier, thereby saving a storage space, increasing a decoding speed, and/or facilitating subsequent querying.

The processing device 140 may perform an encoding processing on the ordered mapping table structure to generate the above-mentioned byte sequence. In some embodiments, through the encoding process, the processing device 140 may generate a first section and a second section corresponding to the ordered mapping table structure. The first section and the second section may be combined to determine the byte sequence. In some embodiments, the byte sequence may include the first section and the second section. The first section may include information relating to data identification and data retrieval corresponding to the ordered mapping table structure. In some embodiments, the first section may be configured to store one or more label items corresponding to the one or more fields. Each of the one or more label items may correspond to one of the one or more fields. In some embodiments, the label item may be an index to the data. The second section may include information relating to the content of the data. In some embodiments, the second section may be configured to store the data of the one or more fields of a same data structure, that is, the data of the one or more fields may be homogenous data in the second section of the byte sequence. According to some embodiments of the present disclosure, the second section may include the homogenous data by generating the ordered mapping table structure and/or encoding the ordered mapping table structure. Besides, the byte sequence including the first section and the second section may be generated by encoding the ordered mapping table structure, which may reduce the storage space occupied by the heterogeneous data to be encoded, and improve the decoding performance.

In some embodiments, for a label item and a corresponding field, the label item may include a field label/field identifier of the corresponding field and a position label of the corresponding field. The field label may include a name of the corresponding field. The field identifier may be used to uniquely identify the corresponding field. In some embodiments, the field identifier may occupy two bytes. For example, the field identifier may be the number "2". The above descriptions may be for illustrative purposes only, and in some embodiments, "field label" and "field identifier" may be used interchangeably.

Figure 8:
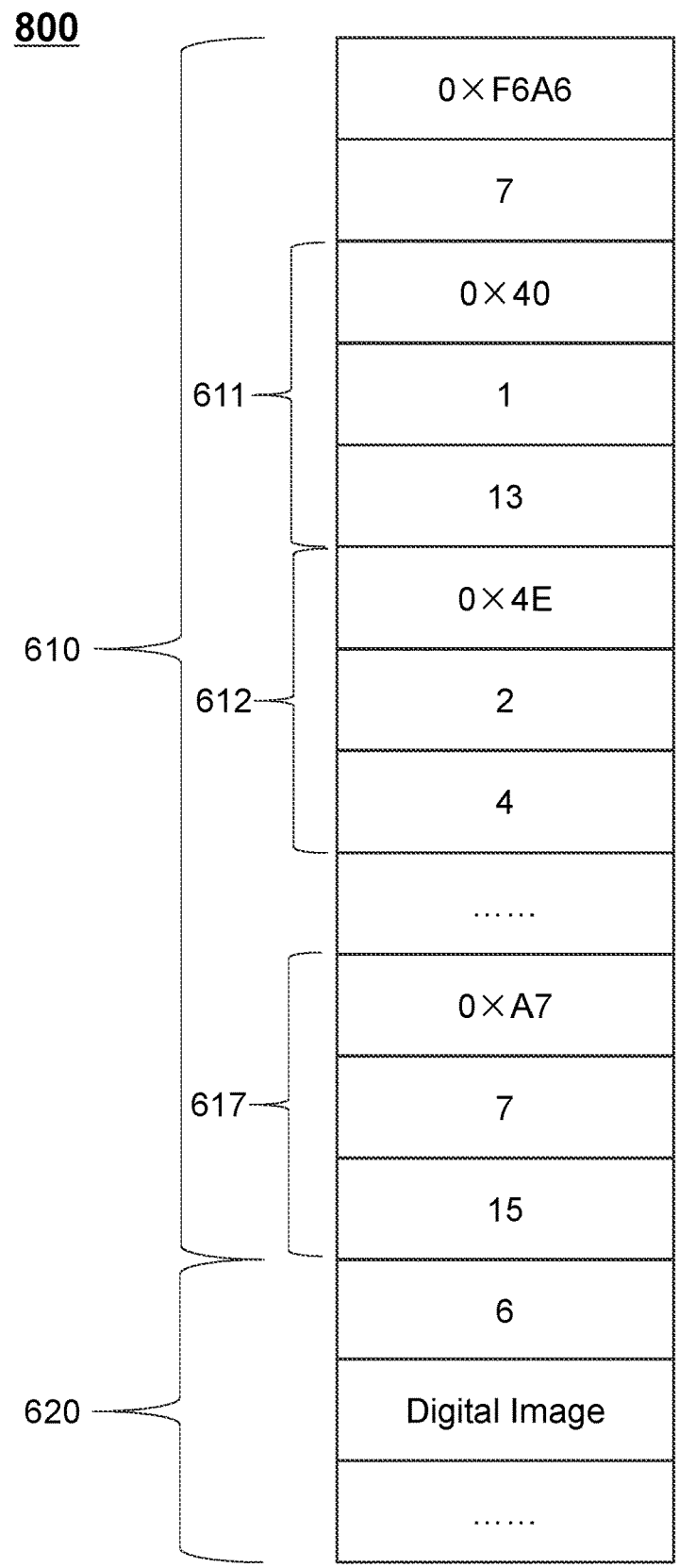
FIG. 8 is a schematic diagram illustrating an exemplary byte sequence according to some embodiments of the present disclosure.

The position label of the corresponding field may be used to identify a position where data of the corresponding field is stored. In some embodiments, the position label of the corresponding field may be configured to identify a position where the data of the corresponding field is stored in the second section. In some embodiments, the position label may include an initial position and a data length of the data of the corresponding field in the second section. Merely by way of example, as shown in FIG. 8, assuming that the field identifier of the corresponding field is 1, the initial position of the corresponding field may be 0x40, and the data length may be 13. In some embodiments, the field identifier may occupy 2 bytes, the initial position may occupy 4 bytes, and the data length may occupy 2 bytes. More descriptions of the label item may be found elsewhere in the present disclosure, FIG. 8, or the descriptions thereof.

In some embodiments, the byte sequence may have a tree data structure implemented using a balanced binary tree. In some embodiments, the byte sequence may be ordered based on one or more field identifiers of the one or more label items. In some embodiments, the one or more label items may be ordered based on the one or more field identifiers of the one or more label items. In some embodiments, as described above, the field identifier may include a numerical number. The processing device 140 may order the one or more label items corresponding to the field identifiers based on one or more numerical numbers of the one or more field identifiers of the one or more label items. For example, a label item corresponding to a field identifier with a smaller number may be located before a label item corresponding to a field identifier with a larger number. In some embodiments, the data of the one or more fields in the second section may also be ordered based on the one or more field identifiers of the one or more label items. For example, data of a field with a smaller field identifier may be located before data of a field with a larger field identifier in the second section, thereby facilitating fast retrieval using binary search.

In some embodiments, the one or more field identifiers and the data of the one or more fields may be stored in a form of metadata based on a treemap structure. The one or more field identifiers may be stored using at least one field structure. The treemap structure may include a hierarchically nested structure. For example, the treemap structure may include a binary tree, a Huffman tree, or the like. The metadata may be in a form of an electronic index or catalog that supports data storage and querying. In some embodiments, the metadata having the treemap structure may be stored as the byte sequence.

According to some embodiments of the present disclosure, by converting the heterogeneous data to be encoded into an ordered mapping table structure, the storage space may be saved, and at the same time, the decoding performance may be improved.

Figure 6:
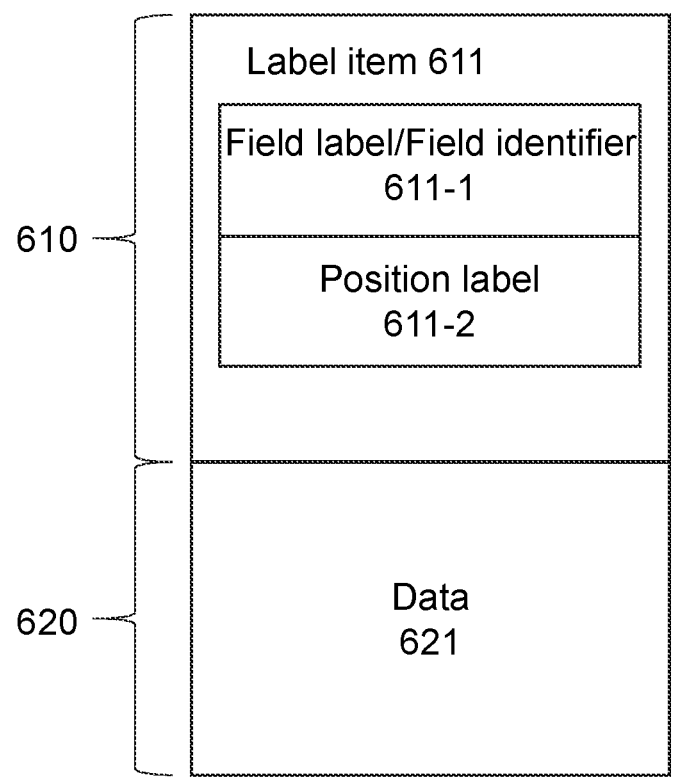
FIG. 6 is a schematic diagram illustrating an exemplary byte sequence according to some embodiments of the present disclosure.

FIG. 6 is a schematic diagram illustrating an exemplary byte sequence according to some embodiments of the present disclosure.

In some embodiments, data of one or more fields (e.g., data in a heterogeneous format) may be stored as a byte sequence 600 as shown in FIG. 6. The byte sequence 600 may include a first section 610 and a second section 620. The first section 610 may contain information relating to data identification and data retrieval of the data of the one or more fields. A label item 611 of a field may include a field label/field identifier 611-1 and a position label 611-2. The field label/field identifier 611-1 may include a field label or a field identifier. The field label may be a field name. The field identifier may be an ID value corresponding to the field name. The position label 611-2 may be used to identify a position where data of the field is stored in the second section 620. The second section 620 may contain information relating to the content of the data of the one or more fields. The second section 620 may include data 621 of a homogenous structure.

In some embodiments, the first section may also include version information of at least one of an encoding technique or a decoding technique used to store the data of the one or more fields. The version information may indicate a situation that the data of the one or more fields are processed via the encoding technique or the decoding technique. When the data of the one or more fields is updated or modified, new version information may be generated. Data updating used herein may refer to appending new data to an existing byte sequence. In some embodiments, different strings may be used to represent the version information of different encoding techniques or different decoding techniques. The version information may be represented by a hexadecimal number. The version information may be used for a version management of encoding or decoding algorithms. In some embodiments, the version information may occupy 4 bytes. For example, as shown in FIG. 8, the version information may be 0xF6A6.

In some embodiments, the first section may also include positioning information. The positioning information may include a count of the one or more fields, a length of the first section, an initial position of the second section, or the like, or any combination thereof. In some embodiments, the count of the one or more fields may occupy 4 bytes. For example, as shown in FIG. 8, the count of the one or more fields may be 7.

Figure 7:
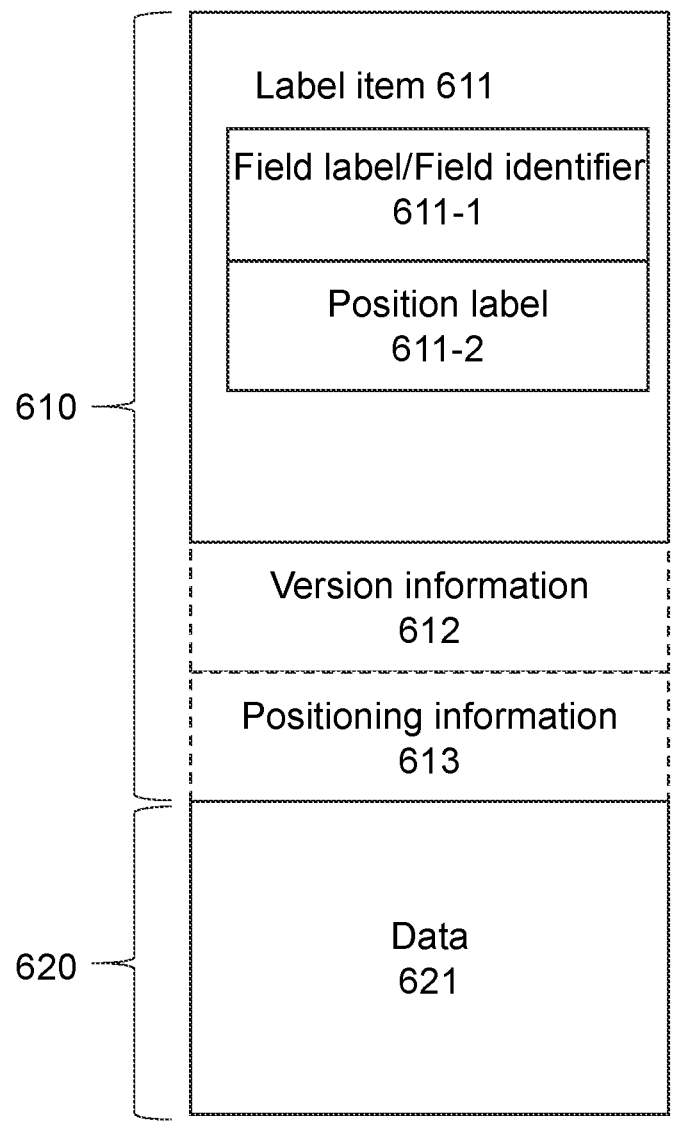
FIG. 7 is a schematic diagram illustrating an exemplary byte sequence according to some embodiments of the present disclosure.

FIG. 7 is a schematic diagram illustrating an exemplary byte sequence according to some embodiments of the present disclosure.

In some embodiments, data of one or more fields (e.g., data in a heterogeneous format) may be stored as a byte sequence 700 as shown in FIG. 7. The byte sequence 700 may include a first section 610 and a second section 620. The first section 610 may include a label item 611, version information 612, and positioning information 613. The label item 611 may include a field label/field identifier 611-1 and a position label 611-2. The field label/field identifier 611-1 may include a field label or a field identifier. The field label may be a field name. The field identifier may be an ID value corresponding to the field name. The position label 611-2 may be used to identify a position where data of a field is stored in the second section 620. The version information 612 may include at least one of an encoding technique or a decoding technique used to store the data of the one or more fields. The positioning information 613 may include at least one of a count of the one or more fields, a length of the first section 610, or an initial position of the second section 620. The second section 620 may include data 621 containing information relating to the content of the data of the one or more fields. The data 621 may have a homogenous structure.

FIG. 8 is a schematic diagram illustrating an exemplary byte sequence according to some embodiments of the present disclosure.

In some embodiments, data of one or more fields (e.g., data in a heterogeneous format) may be stored as a byte sequence 800 as shown in FIG. 8. As shown in FIG. 8, the data of the one or more fields may include one or more digital images. In the byte sequence 800, the version information may be 0xF6A6. There may be 7 fields, that is, there may be 7 label items, and only label items 611, 612, and 617 are shown in FIG. 8. For the label item 611 and a corresponding field, a field identifier may be 1, and a position label may include that an initial position of the corresponding field may be 0x40 and a data length of the corresponding field may be 13. For the label item 612 and a corresponding field, a field identifier may be 2, and a position label may include that an initial position of the corresponding field may be 0x4E and a data length of the corresponding field may be 4. For the label item 617 and a corresponding field, a field identifier may be 7, and a position label may include that an initial position of the corresponding field may be 0XA7 and a data length of the corresponding field may be 15. The label item 611, the label item 612, . . . , the label item 617 may be ordered from up to down according to an order of the field identifiers, that is, the label item 611 may be located before the label item 612, and the label item 612 may be located before the label item 617.

The length of the first section 610 may be a total length of the version information, the positioning information, and the length of the one or more fields contained in one or more label items. An initial position of the second section 620 may be a field position adjacent to an end of the first section 610. The second section 620 may include one or more digital images. The one or more digital images may be arranged in the order of the label items.

In some embodiments, the one or more fields may include at least one parent field and at least one subfield. In some embodiments, the label item may also include a parent identifier configured to identify a parent field of the one or more fields. In some embodiments, the parent field and the subfield may be determined based on a relationship between fields. The parent field may be a field at an upper level, and the subfield may be a field at a lower level. A parent-child relationship between the one or more fields may exist. Each subfield may correspond to only one parent field. A parent field may correspond to one or more subfields. In some embodiments, when a field is selected as a parent field, the processing device 140 may add a parent identifier to a label item corresponding to the field.

In some embodiments, the label item may further include a sub-position identifier and/or a second sub-position identifier. The sub-position identifier may be configured to identify an initial subfield of the parent field. The second sub-position identifier may be configured to identify a position of a subsequent subfield which has a same parent field as the initial subfield. In some embodiments, the sub-position identifier may be a field identifier of the initial subfield. In some embodiments, the second sub-position identifier may be a field identifier of the subsequent subfield which has a same parent field as the initial subfield. According to some embodiments of the present disclosure, by setting the parent field and the subfield, a nested structure among the one or more fields may be realized. In addition, the one or more fields may form a linked list through the parent-child relationship, thereby facilitating inserting, deleting, or querying the one or more fields.

In some embodiments, the label item may also include an identifier of a compression technique used to compress the data of the one or more fields. The identifier of the compression technique may be an identification of a compression ratio and/or a compression technique. In some embodiments, the processing device 140 may record the compression ratio and/or the compression technique when the data of the one or more fields is compressed. The compression ratio may be a ratio of a storage space occupied by the data before the compression to a storage space occupied by the data after the compression. Exemplary compression ratios may be 5, 10, etc. Exemplary compression techniques may include a Huffman coding technique, an arithmetic coding technique, a run-length coding technique, a Lempel-Zev coding technique, a predictive coding technique, a frequency domain coding technique, or the like, or any combination thereof.

In some embodiments, the data of the one or more fields may be stored in the second section based on the compression technique. In some embodiments, the compression technique may be determined based on a data amount and/or a data type (e.g., text, picture, video, etc.) of the one or more fields. In some embodiments, the processing device 140 may determine the data amount of the one or more fields. When the data amount of the one or more fields is smaller than or equal to an amount threshold, the data of the one or more fields may be compressed based on a compression technique with a relatively low compression efficiency; when the data amount of the one or more fields is greater than the amount threshold, the data of the one or more fields may be compressed based on a compression technique with a relatively high compression efficiency. The amount threshold may be determined based on empirical values.

In some embodiments, the compression technique may be determined based on other related field(s) in the metadata database. The related field(s) may include field(s) with a same field label and/or a same data type. In some embodiments, the processing device 140 may use a compression technique of field(s) with the same field label and/or the same data type as a current compression technique of the data of the one or more fields. In some embodiments, the compression technique may be determined based on a historical storage record. For example, the processing device 140 may use a compression technique corresponding to historical data in the historical storage record as the current compression technique of the data of the one or more fields.

In some embodiments, the compression ratio may be determined based on a similar manner to the compression technique. In some embodiments, the compression ratio may be determined based on the data amount and/or the data type (e.g., text, picture, video, etc.) of the one or more fields. In some embodiments, the processing device 140 may determine the data amount of the one or more fields. When the data amount of the one or more fields is smaller than or equal to an amount threshold, the data of the one or more fields may be compressed based on a compression technique with a relatively low compression ratio; when the count of data of the one or more fields is greater than the amount threshold, the data of the one or more fields may be compressed based on a compression technique with a relatively high compression ratio. The amount threshold may be determined based on empirical values.

In some embodiments, the compression ratio may be determined based on other related field(s) in the metadata database. The related field(s) may include field(s) with the same field label and/or the same data type. In some embodiments, the processing device 140 may designate a compression ratio of field(s) with the same field label and/or the same data type as a current compression ratio of the data of the one or more fields. In some embodiments, the compression ratio may be determined based on a historical storage record. For example, the processing device 140 may use a compression ratio corresponding to historical data in the historical storage record as the current compression ratio of the data of the one or more fields.

In some embodiments, the second section may include one or more ending identifiers. For an ending identifier and a corresponding field, the ending identifier may be located at an end of data of the corresponding field. The ending identifier may be configured to identify an ending of the data of the corresponding field, a position of data of a subsequent field of the corresponding field in the second section, or the like, or any combination thereof. For example, if there is a subsequent field, the ending identifier may identify the position of the data of the subsequent field of the corresponding field in the second section; if there is no subsequent field, the ending identifier may identify the ending of the data of the corresponding field.

In some embodiments, when the data length of the one or more fields is less than a maximum data length that the byte sequence can store, the processing device 140 may add the one or more ending identifiers to the end of the stored data in the second section to identify the one or more endings of the one or more fields. In some embodiments, when the data length of the one or more fields is greater than the maximum data length that the byte sequence can store, the processing device 140 may divide the one or more fields to be stored into a plurality of byte sequences, respectively. In some embodiments, the processing device 140 may add the ending identifier to the end of the stored data of the corresponding field in the second section to identify the position of the data of the subsequent field of the corresponding field in the second section.

For example, assuming that the data length of the one or more fields is L1, the maximum data length that the byte sequence can store is L2, if L1<L2, the count of the one or more fields in the positioning information may be a positive value; if L1>L2, the count of the one or more fields in the positioning information may be a negative value. The processing device 140 may reserve 6 bytes at the end of the data of the corresponding field as the ending identifier, wherein 4 bytes are used to record an initial position of subsequent data, and 2 bytes are used to record a storage amount of the data. Through the above process, the data may be directly updated according to the one or more fields, without the need of re-encoding the data that has already been encoded. For example, the updating used herein may include encoding appended data that has not been encoded. If L1>L2, data of data length L2−6 may be stored in the byte sequence, and data of data length L1−(L2−6)+6 may be stored in another byte sequence (e.g., a second byte sequence). Similarly, if the maximum data length that the second byte sequence can store is L3, then L1−(L2−6)+6 and L3 may be compared, and whether the count of the one or more fields in the positioning information of the second byte sequence is a positive value or a negative value may be determined, which may be repeated until the count of the one or more fields in the positioning information of the Nth byte sequence is a positive value, which may indicate that the data to be stored of the one or more fields has been completely stored. Therefore, when the data is updated, if the appended data during the update exceeds a limit, the data may be re-encoded to release a space for the appended data.

Figure 9:
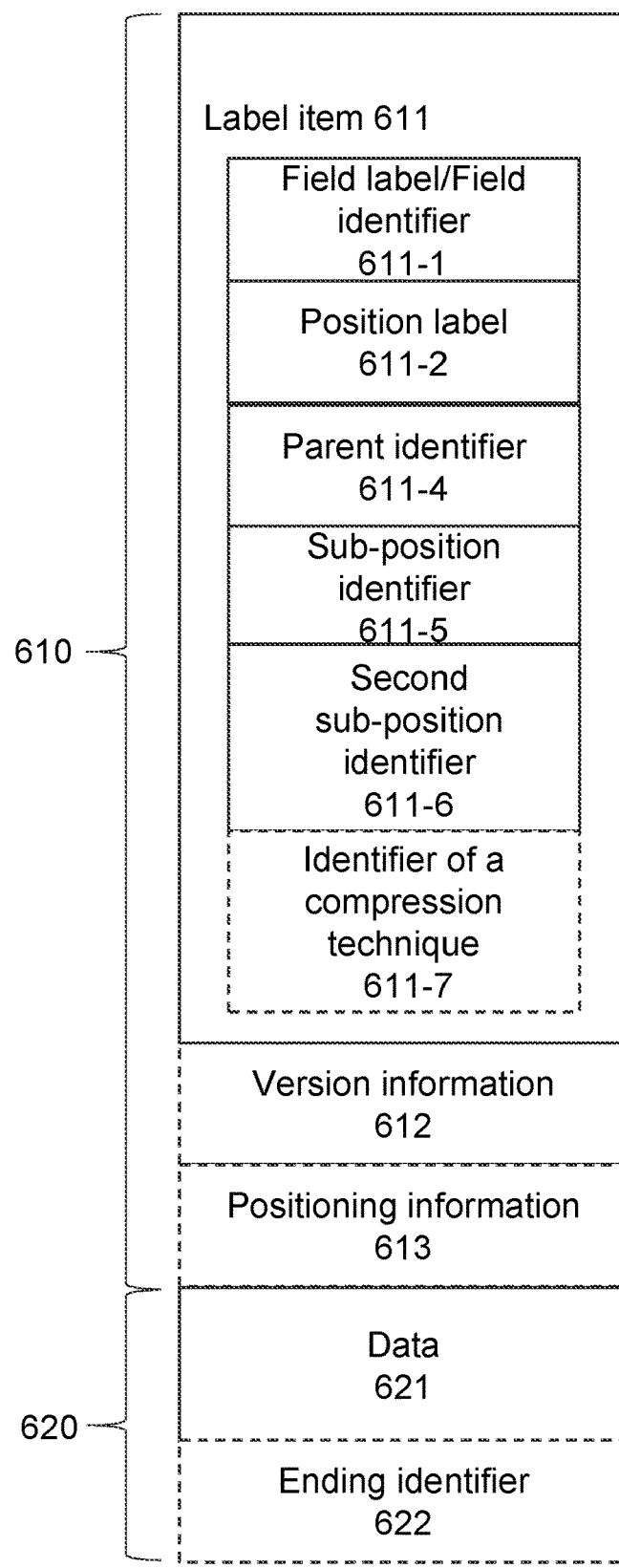
FIG. 9 is a schematic diagram illustrating an exemplary byte sequence according to some embodiments of the present disclosure.

FIG. 9 is a schematic diagram illustrating an exemplary byte sequence according to some embodiments of the present disclosure.

In some embodiments, data of one or more fields (e.g., data in a heterogeneous format) may be stored as a byte sequence 900 as shown in FIG. 9. The byte sequence 900 may include a first section 610 and a second section 620. The first section 610 may include a label item 611, version information 612, and positioning information 613. The label item 611 may include a field label/field identifier 611-1, a position label 611-2, a parent identifier 611-4, a sub-position identifier 611-5, a second sub-position identifier 611-6, and an identifier 611-7 of a compression technique. The second section 620 may include data 621 and an ending identifier 622. The field label/field identifier 611-1 may include a field label or a field identifier. The field label may be a field name. The field identifier may be an ID value corresponding to the field name. The position label 611-2 may be used to identify a position where data of a field is stored in the second section 620.

The sub-position identifier 611-5 may be configured to identify an initial subfield of a parent field. The second sub-position identifier 611-6 may be configured to identify a position of a subsequent subfield which has a same parent field as the initial subfield. The identifier 611-7 may indicate a compression technique used to compress the data of the one or more fields.

The version information 612 may include at least one of an encoding technique or a decoding technique used to store the data of the one or more fields. The positioning information 613 may include at least one of a count of the one or more fields, a length of the first section 610, or an initial position of the second section 620. The second section 620 may include data 621 containing information relating to the content of the data of the one or more fields. The data 621 may have a homogenous structure.

Figure 10:
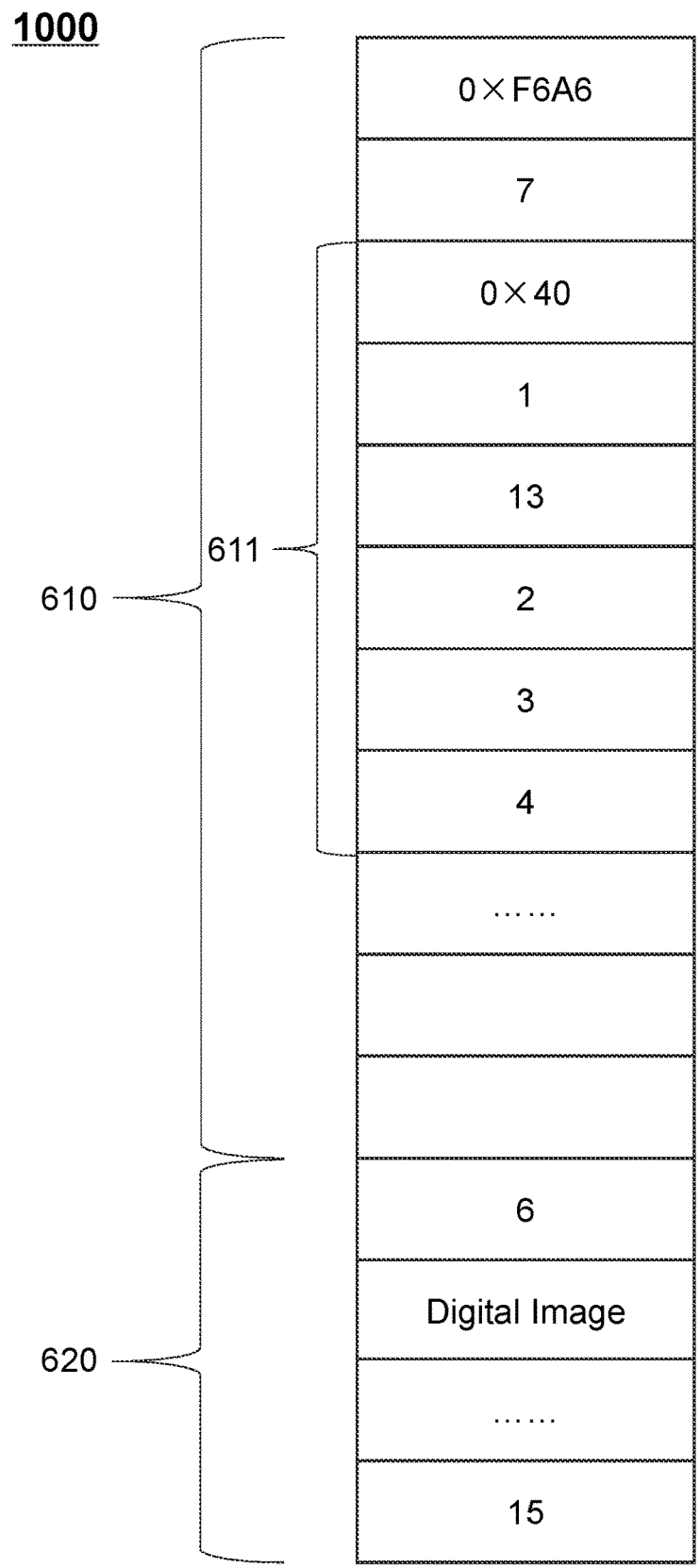
FIG. 10 is a schematic diagram illustrating an exemplary byte sequence according to some embodiments of the present disclosure.

FIG. 10 is a schematic diagram illustrating an exemplary byte sequence according to some embodiments of the present disclosure.

In some embodiments, data of one or more fields (e.g., data in a heterogeneous format) may be stored as a byte sequence 1000 as shown in FIG. 10. As shown in FIG. 10, the data of the one or more fields may include one or more digital images. In the byte sequence 1000, the version information may be 0xF6A6. There may be 7 fields, that is, there may be 7 label items, and only label item 611 is shown in FIG. 10. For the label item 611 and a corresponding field, a field identifier may be 1, and a position label may include that an initial position of the corresponding field may be 0x40 and a data length of the corresponding field may be 13. A parent identifier may be 2, indicating that a parent field is a field with a field identifier of 2. A sub-position identifier may be 3, indicating that a field identifier of an initial subfield of the parent field may be 3. A second sub-position identifier may be 4, indicating that a field identifier of a subsequent subfield which has a same parent field as the initial subfield may be 4. The second section 620 may include an ending identifier. The ending identifier may be 15, indicating that a field identifier of a subsequent field of the corresponding field may be 15.

In some embodiments, the processing device 140 may encrypt a sensitive field among the one or more fields. The sensitive field may be a special field that requires encryption, such as a field including confidential information. The sensitive field may be determined manually. In some embodiments, the label item may also include an encryption technique and/or an encrypted field corresponding to the sensitive field. For example, the encryption technique may include symmetric encryption, asymmetric encryption, or the like.

In some embodiments, when the data amount of the one or more fields is relatively large and the update frequency is relatively low, the processing device 140 may encode and save data of the same field or field(s) of the same data structure only once, thereby saving the storage space. For example, when data of multiple fields are the same, the processing device 140 may only save data of one of the multiple fields, so as to reduce the occupation of the data in the storage space.

In some embodiments, the processing device 140 may record a count of newly added labels stored in the first section, so as to realize adding new fields without re-encoding.

In some embodiments of the present disclosure, by storing the data in segments (e.g., in field by field), the recording of the whole data may be avoided when the data is updated, thereby further improving the storage efficiency.

In some embodiments, the processing device 140 may encode the data of the one or more fields to store the data of the one or more fields as the byte sequence. An exemplary encoding process may include: S1. obtaining one or more field identifiers assigned to the one or more fields, e.g., through a metadata platform; S2. converting the one or more fields (e.g., field name(s) thereof) into the one or more field identifiers based on a maptree structure of a basic data type, and recording all field names of the data of the one or more fields and original data type(s) of the data; S3. based on the converted maptree structure and the recorded original data type(s) of the data, constructing the one or more label items of the one or more fields and outputting a final encoded byte sequence. For example, the data types may include a string, a numeric type (such as a logical value, an integer, a long integer, a floating point number), etc.

In some embodiments, the processing device 140 may decode the stored data of the one or more fields (i.e., data to be queried) for data analysis and querying. An exemplary decoding process may include: S1. obtaining the first section and the second section corresponding to the data to be decoded by querying a metadata management platform; S2. obtaining decoded data by performing a decoding processing based on the first section and the second section corresponding to the data to be decoded. In some embodiments, a traversal query may be performed according to the one or more label identifiers of the one or more fields. For example, the one or more label items of the one or more fields may be obtained based on the first section corresponding to the data to be decoded. When a label identifier of a field is matched, positioning information of the field may be obtained, and the position of the field may be determined based on the positioning information to obtain the decoded data.

In some embodiments, the processing device 140 may obtain a label item of each field in the data to be decoded. The data to be decoded may be an encoded byte sequence. The label item of each field in the data to be decoded may be obtained first for decoding the encoded byte sequence. The label item of each field may be obtained by querying a metadata management platform. In some embodiments, the label item may include a field label, a position label, a field identifier, or the like, or any combination thereof. In some embodiments, the data to be decoded may include more than one field, and each field may include a field identifier assigned by the metadata management platform. The field identifier may also be referred to as an ID value. The ID value may be used in ordering and storing each field in the data to be decoded, facilitating fast retrieval using a binary search when a specific field of the data to be decoded is retrieved.

In some embodiments, the processing device 140 may generate a data table of the data to be decoded based on the field label of each field in the data to be decoded and a mapping relationship between the field label of each field and the corresponding field identifier. The data table may be a logical table that can be queried and analyzed by using SQL syntax.

In some embodiments, if the field identifier corresponding to each field is obtained by querying the data table of the data to be decoded, the processing device 140 may perform a decoding processing on the data to be decoded to obtain the decoded data. Specifically, the query may be performed according to the field identifier corresponding to each field. The data to be decoded may be decoded according to the field identifier of each field, and the data of the one or more fields corresponding to the field identifier may be obtained as the decoded data.

In some embodiments, the processing device 140 may search in the first section according to a predetermined field identifier. If the predetermined field identifier is the same as a field identifier in the first section, data corresponding to a field of the field identifier may be obtained according to the field identifier and determined as the decoded data. According to a second predetermined field identifier (e.g., a field identifier in the middle of one or more field identifiers of the first section), the first section may be searched by dichotomy to determine whether there is a field identifier in the first section that is the same as the predetermined field identifier. If the predetermined field identifier is the same as the second predetermined field identifier, the data corresponding to the second predetermined field identifier may be obtained as the decoded data. If the predetermined field identifier is different from the second predetermined field identifier, whether the predetermined field identifier is greater than the second predetermined field identifier may be determined. If the predetermined field identifier is greater than the second predetermined field identifier, the searching may be performed within a range next to the second predetermined field identifier until a field identifier that is the same as the predetermined field identifier is found; if the predetermined field identifier is smaller than the second predetermined field identifier, the searching may be performed within a range previous to the second predetermined field identifier until a field identifier that is the same as the predetermined field identifier is found.

Some embodiments of the present disclosure may provide an encoding and decoding device for heterogeneous data. The device may be configured to perform operations including: storing data of one or more fields as a byte sequence, the byte sequence comprising a first section and a second section, the second section being configured to store the data of the one or more fields, the first section being configured to store one or more label items corresponding to the one or more fields, wherein for one of the one or more label items and a corresponding field, the label item includes a field label of the corresponding field and a position label of the corresponding field; and the position label of the corresponding field is configured to identify a position where data of the corresponding field is stored in the second section. For more details, please refer to FIGS. 5-10, or the descriptions thereof.

Some embodiments of the present disclosure may provide a computing device. The computing device may include a memory and a processor. A computer program may be stored in the memory. When executing the computer program, the processor may implement operations including: storing data of one or more fields as a byte sequence, the byte sequence comprising a first section and a second section, the second section being configured to store the data of the one or more fields, the first section being configured to store one or more label items corresponding to the one or more fields, wherein for one of the one or more label items and a corresponding field, the label item includes a field label of the corresponding field and a position label of the corresponding field; and the position label of the corresponding field is configured to identify a position where data of the corresponding field is stored in the second section. For more details, please refer to FIGS. 5-10, or the descriptions thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" may mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±1%, ±5%, ±10%, or ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system, comprising:
   at least one storage device comprising a memory, wherein a set of instructions are stored;
   at least one processor coupled with the memory in communication with the at least one storage device, wherein when executing the set of instructions, the at least one processor is configured to cause the system to perform operations including:

storing data of one or more fields as a byte sequence, the byte sequence comprising a first section and a second section, the second section being configured to store the data of the one or more fields, the first section being configured to store one or more label items corresponding to the one or more fields, wherein for one of the one or more label items and a corresponding field, the label item includes a field label of the corresponding field, a position label of the corresponding field, a parent identifier, a sub-position identifier, and a second sub-position identifier;

the parent identifier is configured to identify a parent field of the one or more fields;

the sub-position identifier is configured to identify an initial subfield of the parent field;

the second sub-position identifier is configured to identify a position of a subsequent subfield which has a same parent field as the initial subfield; and the position label of the corresponding field is configured to identify a position where data of the corresponding field is stored in the second section.

2. The system of claim 1, wherein
the label item includes a field identifier of the corresponding field, the field identifier includes an identity of the corresponding field.

3. The system of claim 2, wherein the one or more label items are ordered based on one or more field identifiers of the one or more label items.

4. The system of claim 2, wherein
the one or more field identifiers and the data of the one or more fields are stored in a form of metadata based on a maptree structure; and
the one or more field identifiers are stored via at least one field structure.

5. The system of claim 1, wherein the first section further includes version information of at least one of an encoding technique or a decoding technique used to store the data of the one or more fields.

6. The system of claim 1, wherein
the first section further includes positioning information; and
the positioning information includes at least one of a count of the one or more fields, a length of the first section, or an initial position of the second section.

7. The system of claim 1, wherein the label item further includes an identifier of a compression technique used to compress the data of the one or more fields.

8. The system of claim 7, wherein the data of the one or more fields is stored in the second section based on the compression technique.

9. The system of claim 1, wherein
the second section includes one or more ending identifiers, one of the one or more ending identifiers being located at an end of the data of the corresponding field; and
the ending identifier is configured to identify at least one of an ending of the corresponding field, or a position of data of a subsequent field of the corresponding field in the second section.

10. A method, implemented on a computing device having at least one processor and at least one storage device comprising a memory, comprising:
storing data of one or more fields as a byte sequence, the byte sequence comprising a first section and a second section, the second section being configured to store the data of the one or more fields, the first section being configured to store one or more label items corresponding to the one or more fields, wherein for one of the one or more label items and a corresponding field, the label item includes a field label of the corresponding field, a position label of the corresponding field, a parent identifier, a sub-position identifier, and a second sub-position identifier;

the parent identifier is configured to identify a parent field of the one or more fields;

the sub-position identifier is configured to identify an initial subfield of the parent field;

the second sub-position identifier is configured to identify a position of a subsequent subfield which has a same parent field as the initial subfield; and the position label of the corresponding field is configured to identify a position where data of the corresponding field is stored in the second section.

11. The method of claim 10, wherein
the label item includes a field identifier of the corresponding field, the field identifier includes an identify of the corresponding field.

12. The method of claim 11, wherein the one or more label items are ordered based on one or more field identifiers of the one or more label items.

13. The method of claim 10, wherein the first section further includes version information of at least one of an encoding technique or a decoding technique used to store the data of the one or more fields.

14. The method of claim 10, wherein
the first section further includes positioning information; and
the positioning information includes at least one of a count of the one or more fields, a length of the first section, or an initial position of the second section.

15. The method of claim 10, wherein the label item further includes an identifier of a compression technique used to compress the data of the one or more fields.

16. The method of claim 10, wherein
the second section includes one or more ending identifiers, one of the one or more ending identifiers being located at an end of the data of the corresponding field; and
the ending identifier is configured to identify at least one of an ending of the corresponding field, or a position of data of a subsequent field of the corresponding field in the second section.

17. A non-transitory computer-readable medium including executable instructions, wherein when executed by at least one processor, the executable instructions direct the at least one processor to perform a method, and the method includes:
storing data of one or more fields as a byte sequence, the byte sequence comprising a first section and a second section, the second section being configured to store the data of the one or more fields, the first section being configured to store one or more label items corresponding to the one or more fields, wherein for one of the one or more label items and a corresponding field, the label item includes a field label of the corresponding field, a position label of the corresponding field, a parent identifier, a sub-position identifier, and a second sub-position identifier;

the parent identifier is configured to identify a parent field of the one or more fields;

the sub-position identifier is configured to identify an initial subfield of the parent field;

the second sub-position identifier is configured to identify a position of a subsequent subfield which has a same parent field as the initial subfield; and the position label of the corresponding field is configured to identify a position where data of the corresponding field is stored in the second section.

* * * * *